(12) United States Patent  
Kim et al.

(10) Patent No.: US 8,502,374 B2  
(45) Date of Patent: Aug. 6, 2013

(54) POWER MODULE PACKAGE AND METHOD FOR MANUFACTURING THE SAME

(75) Inventors: Kwang Soo Kim, Gyunggi-do (KR); Young Ki Lee, Gyunggi-do (KR); Sung Keun Park, Gyunggi-do (KR); Seog Moon Choi, Seoul (KR); Chang Hyun Lim, Seoul (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 0 days.

(21) Appl. No.: 13/281,285

(22) Filed: Oct. 25, 2011

(65) Prior Publication Data

US 2013/0009291 A1    Jan. 10, 2013

(30) Foreign Application Priority Data

Jul. 4, 2011    (KR) .................. 10-2011-0065996

(51) Int. Cl.  
*H01L 23/34* (2006.01)

(52) U.S. Cl.  
USPC ........... 257/723; 257/724; 257/666; 257/787; 257/691

(58) Field of Classification Search  
USPC ............. 257/691, 699, 723, 724, 686, 777, 257/666, 787  
See application file for complete search history.

(56) References Cited

U.S. PATENT DOCUMENTS

| | | | | |
|---|---|---|---|---|
| 5,701,034 A | * | 12/1997 | Marrs | 257/706 |
| 6,624,511 B2 | * | 9/2003 | Sakamoto et al. | 257/734 |
| 7,224,047 B2 | * | 5/2007 | Carberry et al. | 257/676 |
| 8,183,088 B2 | * | 5/2012 | Jeon et al. | 438/106 |
| 2006/0108673 A1 | * | 5/2006 | Germain et al. | 257/678 |
| 2006/0108675 A1 | * | 5/2006 | Colgan et al. | 257/684 |
| 2006/0223238 A1 | * | 10/2006 | Koh et al. | 438/123 |
| 2012/0007225 A1 | * | 1/2012 | Hasebe et al. | 257/676 |

FOREIGN PATENT DOCUMENTS

| | | |
|---|---|---|
| KR | 1020090104478 A | 10/2009 |
| KR | 1020100126909 A | 12/2010 |

OTHER PUBLICATIONS

Office Action from counterpart Korean Patent Application No. 10-2011-0065996, mailed Sep. 5, 2012, 4 pages, English Summary included.

* cited by examiner

*Primary Examiner* — S. V. Clark  
(74) *Attorney, Agent, or Firm* — Blakely Sokoloff Taylor & Zafman LLP

(57) ABSTRACT

Disclosed herein are a power module package and a method for manufacturing the same. The power module package includes: a base substrate having grooves formed between a plurality of semiconductor device mounting areas; semiconductor devices mounted on the semiconductor device mounting areas of the base substrate; and a molding formed on the base substrate and in inner portions of the grooves.

22 Claims, 5 Drawing Sheets

POWER MODULE PACKAGE AND METHOD FOR MANUFACTURING THE SAME

CROSS REFERENCE TO RELATED APPLICATION

This application claims the benefit of Korean Patent Application No. 10-2011-0065996, filed on Jul. 4, 2011, entitled "Power Module Package and Method for Manufacturing the Same", which is hereby incorporated by reference in its entirety into this application.

BACKGROUND OF THE INVENTION

1. Technical Field

The present invention relates to a power module package and a method for manufacturing the same.

2. Description of the Related Art

In accordance with a global increase in energy usage, the interest in efficient use of limited energy has significantly increased. Therefore, the adoption of an inverter using an intelligent power module (IPM) for efficiently converting energy in home appliances and industrial products has accelerated.

In accordance with an increase in use of this power module, the market's demand for a power module having high integration density, high capacity, and a small size has increased. Therefore, the interest in the necessity of solving a heat generation problem of an electronic component has significantly increased.

Particularly, when a high capacity power device (for example, a high capacity insulated gate bipolar transistor (IGBT), or the like) is used, heat generated from a high heat generating power device has an influence on a control device relatively vulnerable to the heat, thereby causing deterioration of performance and long-term reliability of the entire module.

Therefore, a high heat radiation package structure solving the heat generation problem has been demanded in order to increase efficiency of the power module and secure high reliability.

SUMMARY OF THE INVENTION

The present invention has been made in an effort to provide a power module package allowing a semiconductor device expected to generate high heat and a semiconductor device generating relatively low heat to be thermally separated from each other, and a method for manufacturing the same.

According to a first preferred embodiment of the present invention, there is provided a power module package including: a base substrate having grooves formed between a plurality of semiconductor device mounting areas; semiconductor devices mounted on the semiconductor device mounting areas of the base substrate; and a molding formed on the base substrate and in inner portions of the grooves.

The semiconductor device may include a power device and a control device, the plurality of semiconductor device mounting areas may include a power device mounting area and a control device mounting area, and the grooves may be formed between the power device mounting area and the control device mounting area.

The semiconductor device may include a power device and a control device, the plurality of semiconductor device mounting areas may include a plurality of power device mounting areas, and the grooves may be formed between each of the plurality of power device mounting areas.

The semiconductor device may include a power device and a control device, the plurality of semiconductor device mounting areas may include a plurality of power device mounting areas and a control device mounting area, and the grooves may be formed between the power device mounting area and the control device mounting area or between each of the plurality of power device mounting areas.

The power module package may further include a metal layer formed on the base substrate and including circuits and connection pads, wherein the semiconductor devices are mounted on the metal layer.

The power module package may further include lead frames formed on the metal layer; and wires connecting between the semiconductor devices or electrically connecting the semiconductor devices and the lead frames to each other.

The molding may be formed so as to enclose an upper portion of the base substrate and a side thereof.

The groove may have a row form in which it is configured by a plurality of grooves.

The base substrate may be made of a ceramic.

According to a second preferred embodiment of the present invention, there is provided a method for manufacturing a power module package, the method including: preparing a base substrate; forming grooves between a plurality of semiconductor device mounting areas of the base substrate; mounting semiconductor devices on the semiconductor device mounting areas; and forming a molding on the base substrate and in inner portions of the grooves.

The semiconductor device may include a power device and a control device, the plurality of semiconductor device mounting areas may include a power device mounting area and a control device mounting area, and in the forming of the grooves, the grooves may be formed between the power device mounting area and the control device mounting area.

The semiconductor device may include a power device and a control device, the plurality of semiconductor device mounting areas may include a plurality of power device mounting areas, and in the forming of the grooves, the grooves may be formed between each of the plurality of power device mounting areas.

The semiconductor device may include a power device and a control device, the plurality of semiconductor device mounting areas may include power device mounting areas and a control device mounting area, and in the forming of the grooves, the grooves may be formed between the power device mounting area and the control device mounting area or between each of the power device mounting areas.

In the forming of the molding, the molding may be formed so as to enclose an upper portion of the base substrate and a side thereof.

The method may further include, before the mounting of the semiconductor devices, forming a metal layer including circuits and connection pads on the base substrate, wherein in the mounting of the semiconductor devices, the semiconductor devices are mounted on the to metal layer.

The method may further include: forming lead frames on the base substrate; and forming wires connecting between the semiconductor devices or electrically connecting the semiconductor devices and the lead frames to each other.

The groove may have a row form in which it is configured by a plurality of grooves.

The base substrate may be made of a ceramic.

DESCRIPTION OF THE PREFERRED EMBODIMENTS

Figure 1:
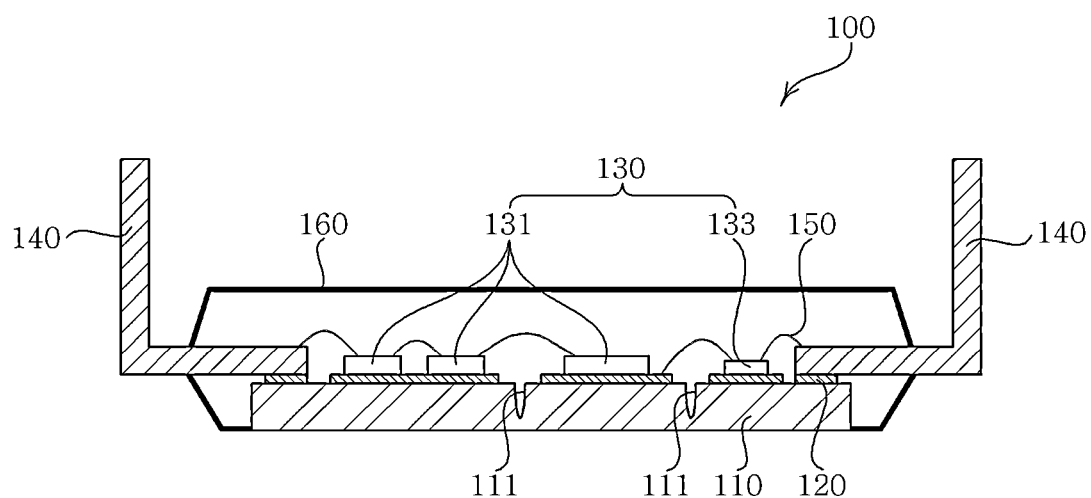
FIG. 1 is a view showing a configuration of a power module package according to a preferred embodiment of the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted. In the description, the terms "first", "second", and so on are used to distinguish one element from another element, and the elements are not defined by the above terms.

Hereinafter, preferred embodiments of the present invention will be described in detail with reference to the accompanying drawings.

Power Module Package

FIG. 1 is a view showing a configuration of a power module package according to a preferred embodiment of the present invention.

As shown in FIG. 1, a power module package 100 includes a base substrate 110 having grooves 111 formed between a plurality of semiconductor device mounting areas, semiconductor devices 130 mounted on the semiconductor device mounting areas of the base substrate 110, and a molding 160 formed on the base substrate 110 and in inner portions of the grooves 111.

Here, the base substrate may be made of a ceramic in consideration of thermal transfer efficiency but is not limited thereto.

In addition, the molding 160 may be formed so as to enclose an upper portion and a side of the base substrate 110.

For example, as shown in FIG. 1, since the molding 160 is formed in a form in which it is filled in the inner portions of the grooves 111, heat is not only blocked by the grooves 111 formed between the semiconductor device mounting areas but also secondarily blocked by the molding 160, thereby making it possible to further improve a heat radiation effect.

In addition, since the molding 160 is formed in a form in which it is filled in the grooves 111 formed in the base substrate 110, an adhesion between the molding 160 and the base substrate 110 is increased to reduce generation of a problem such as delamination between the substrate and the molding, or the like, thereby making it possible to improve long-term reliability of the substrate.

In addition, the semiconductor device 130 may include power devices 131 and control devices 133. For example, the power device 131 may include an insulated gate bipolar transistor (IGBT), a diode, or the like, and the control device 132 may include a control integrated circuit (IC), or the like.

Therefore, the plurality of semiconductor device mounting areas may include a power device mounting area and a control device mounting area. Here, each of the power device mounting area and the control device mounting area may be divided into a plurality of areas.

Figure 2:
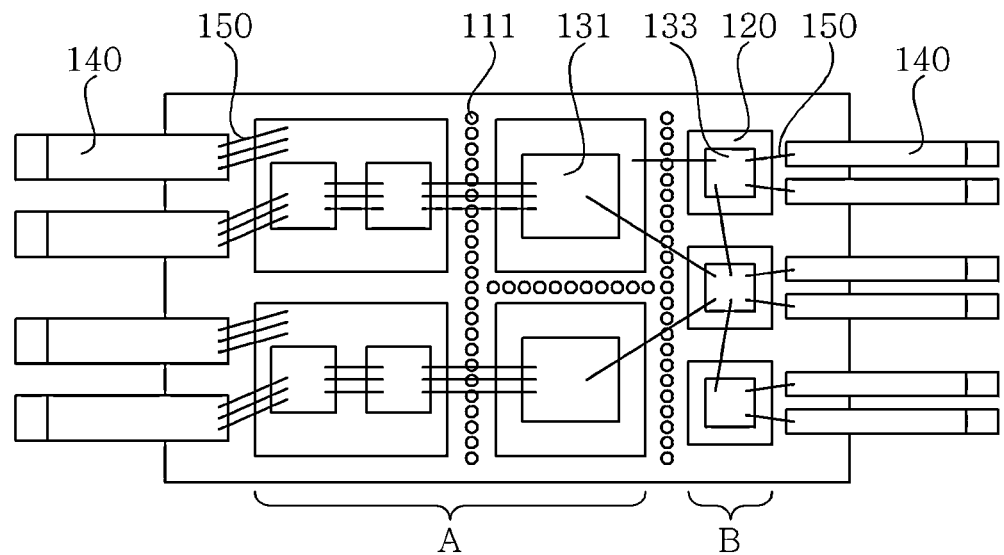
FIG. 2 is a plan view of the power module package of FIG. 1.

For example, as shown in FIG. 2, the semiconductor device mounting area may be divided into the power device mounting area A and the control device mounting area B. In addition, as shown in FIG. 3, the area A may be divided into areas A-1, A-2, A-3, and A-4.

Figure 3:
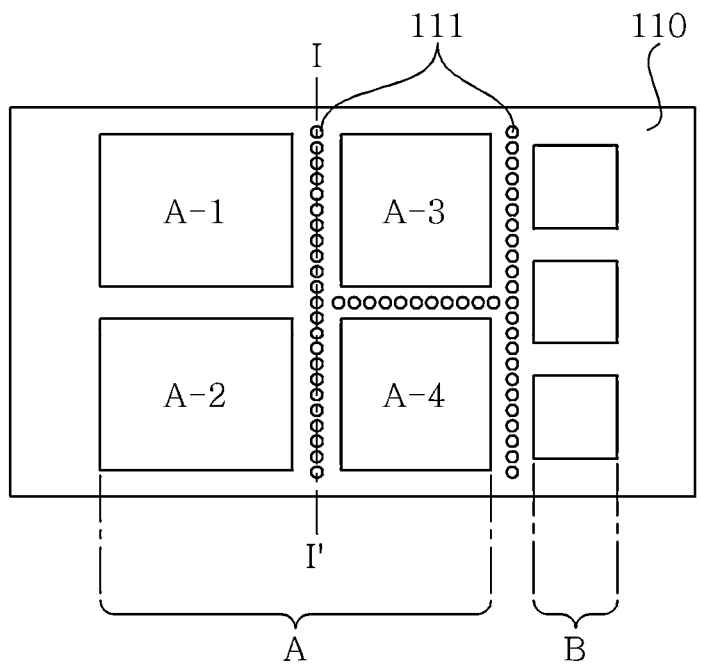
FIGS. 3 to 5 are views specifically showing a configuration of a groove according to a preferred embodiment of the present invention.
Figure 4:
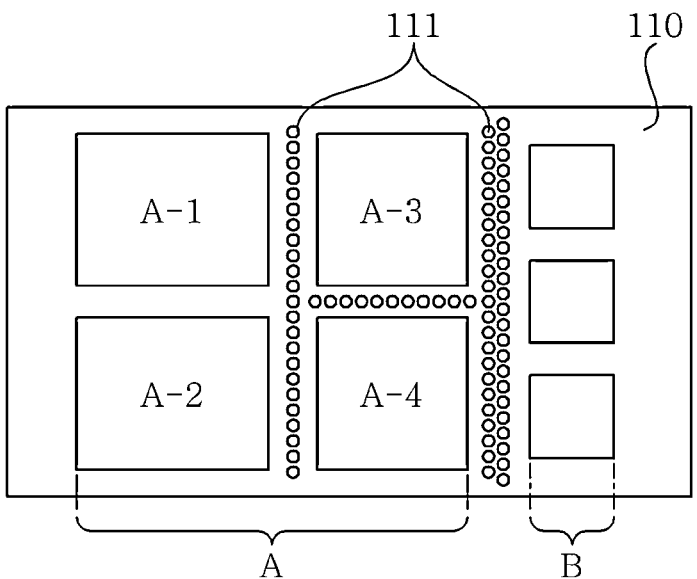
Figure 5:
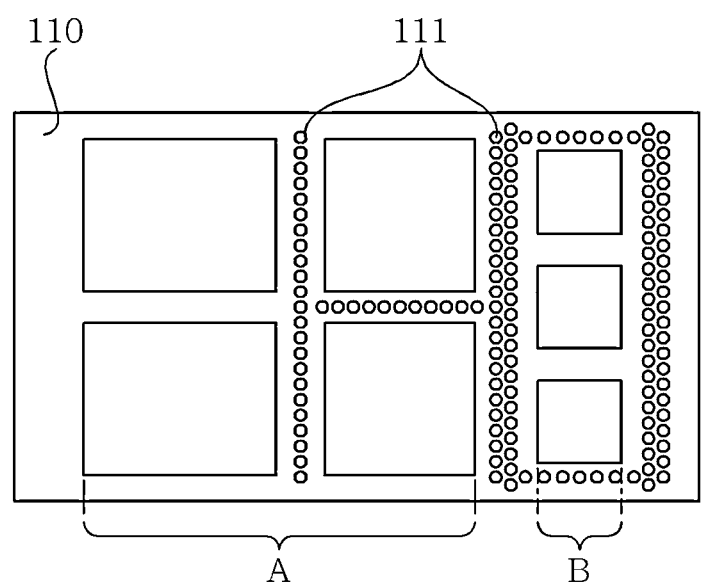

As shown in FIGS. 3 to 5, the groove 111 may have a row form in which it is configured of a plurality of grooves but is not limited thereto.

The groove 111 having the above-mentioned form may be formed so that an influence by heat transfer between semiconductor devices may be minimized as shown in FIGS. 3 to 5.

More specifically, the grooves 111 may be formed between the power device mounting area and the control device mounting area, be formed between each of the plurality of power device mounting areas, or be formed in a combined structure thereof.

For example, in the case in which A-1, A-2, A-3, and A-4 are the power device mounting areas and B is the control device mounting area in FIGS. 3 and 4, the grooves may be formed between the power device mounting area A and the control device mounting area to B or be formed between each of the plurality of power device mounting areas, that is, between A-1/A-2 and A-3/A-4 and between A-3 and A-4.

In addition, as shown in FIG. 4, the groove 111 between the power device mounting area and the control device mounting area may also be implemented as two or more rows of grooves in order to minimize heat transfer to an area (the control device mounting area B) requiring a high heat radiation property as needed.

In addition, as shown in FIG. 5, two or more rows of grooves 111 may be formed around the control device mounting area B.

Figure 6:
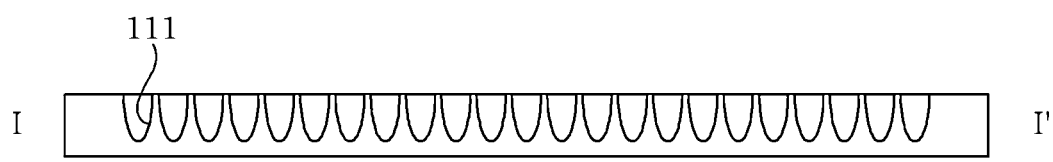
FIGS. 6 and 7 are views describing a shape of a groove according to a preferred embodiment of the present invention.

In addition, a cross section of the grooves taken along line I-I' of FIG. 3 is shown in FIG. 6. Further, a processing form of the grooves 111 is shown in FIG. 7.

Figure 7:
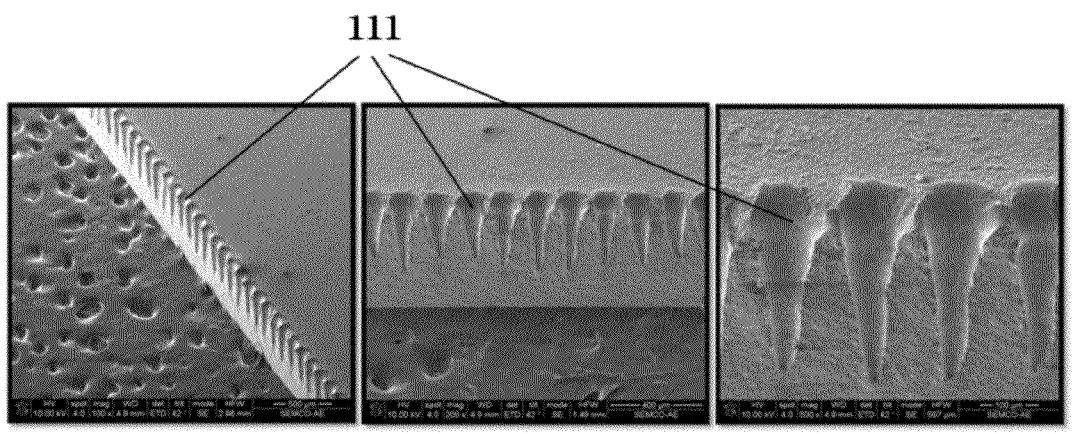

As shown in FIGS. 6 and 7, the grooves 111 are processed at any depth in a thickness direction of the base substrate 110, such that a thickness of the base substrate 110 is reduced at lower portions of the grooves 111. Therefore, a heat transfer route of the base substrate 110 is reduced at the lower portions of the grooves 111, thereby making it possible to further increase a heat radiation effect.

Meanwhile, as shown in FIG. 1, the power module package 100 may further include a metal layer 120 formed on the base substrate 110 and including circuits and connection pads. In this configuration, the semiconductor devices 130 are mounted on the metal layer 120.

In addition, the power module package 100 may further include lead frames 140 formed on the metal layer 120.

In this configuration, the lead frames 140 are mounted on the metal layer (the left and the right of FIG. 1) on which the semiconductor devices 130 is not mounted.

In addition, the power module package 100 may further include wires 150 connecting between the semiconductor devices 130 or electrically connecting the semiconductor devices 130 and the lead frames 140 to each other.

Method for Manufacturing Power Module Package

Figure 8:
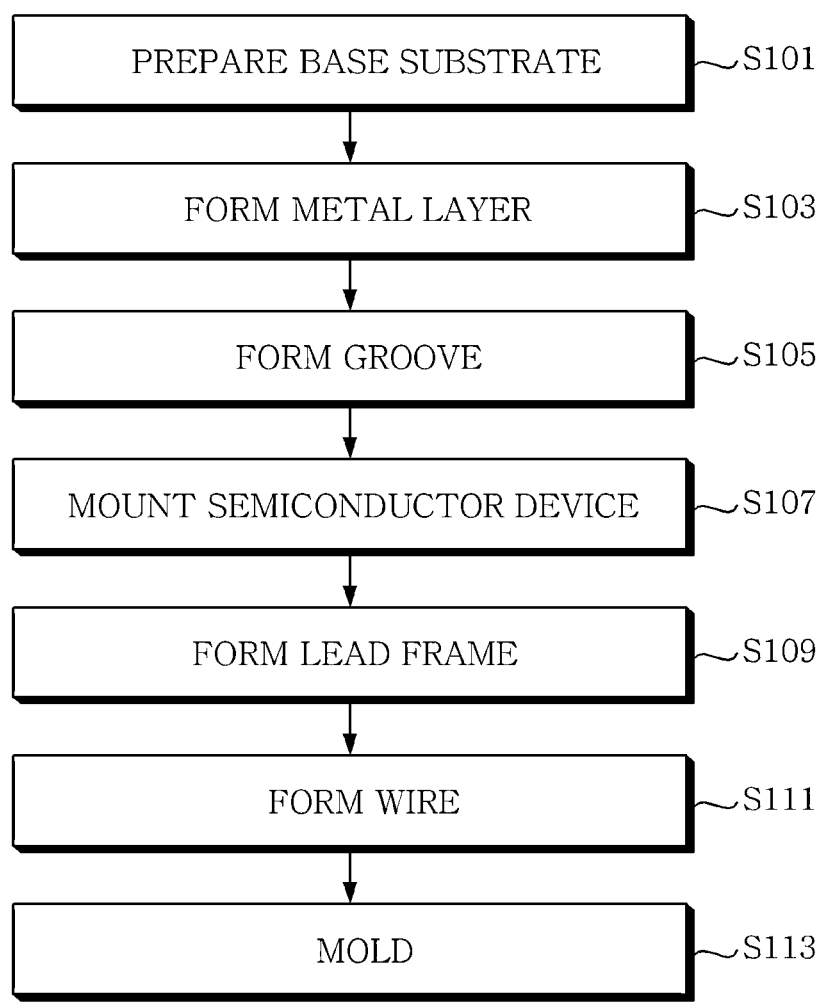
FIG. 8 is a flow chart describing a method for manufacturing a power module package according to a preferred embodiment of the present invention.

FIG. 8 is a flow chart describing a method for manufacturing a power module package according to a preferred embodiment of the present invention. The method for manufacturing a power module package according to the preferred embodiment of the present invention will be described with reference to FIGS. 1 to 5, and FIG. 8.

First, a base substrate 110 is prepared (S101).

Here, the base substrate may be made of a ceramic in consideration of thermal transfer efficiency but is not limited thereto.

Next, a metal layer 120 including circuits and connection pads are formed on the base substrate 110 (S103). Here, the metal layer 120 including the circuits and the connection pads may be made of any material used as a metal for a circuit in a circuit board field, including copper.

When semiconductor devices 130 are directly mounted on the base substrate 110, an operation (S103) may be omitted.

Then, grooves 111 are formed between a plurality of semiconductor device mounting areas of the base substrate 110 (S105). Here, the groove 111 may have a row form in which it is configured of a plurality of grooves.

According to the preferred embodiment of the present invention, the semiconductor device 130 may include power devices 131 and control devices 133.

In addition, the plurality of semiconductor device mounting areas may include a power device mounting area and a control device mounting area. Here, each of the power device mounting area and the control device mounting area may be divided into a plurality of areas.

For example, as shown in FIG. 2, the semiconductor device mounting area may be divided into the power device mounting area A and the control device mounting area B. In addition, as shown in FIG. 3, the area A may be divided into areas A-1, A-2, A-3, and A-4.

As shown in FIGS. 3 to 5, the grooves 111 may be formed so that an influence by heat transfer between semiconductor devices may be minimized.

More specifically, the grooves 111 may be formed between the power device mounting area and the control device mounting area, be formed between each of the plurality of power device mounting areas, or be formed in a combined structure thereof.

For example, in the case in which A-1, A-2, A-3, and A-4 are the power device mounting areas and B is the control device mounting area in FIGS. 3 and 4, the grooves may be formed between the power device mounting area A and the control device mounting area B or be formed between each of the plurality of power device mounting areas, that is, between A-1/A-2 and A-3/A-4 and between A-3 and A-4.

In addition, as shown in FIG. 4, the groove 111 between the power device mounting area and the control device mounting area may also be implemented as two or more rows of grooves in order to minimize heat transfer to an area (the control device mounting area B) requiring a high heat radiation property as needed.

In addition, as shown in FIG. 5, two or more rows of grooves 111 may be formed around the control device mounting area B.

Thereafter, the semiconductor devices 130 are mounted on the semiconductor device mounting areas (S107).

For example, the power device 131 may include an insulated gate bipolar transistor (IGBT), a diode, or the like, and the control device 133 may include a control integrated circuit (IC), or the like.

In the case in which the metal layer 120 is formed before this operation, the semiconductor devices 130 are mounted on the metal layer 120.

Next, lead frames 140 are formed on the base substrate 110 (S109).

In the case in which the metal layer 120 is formed before this operation, the lead frames 140 are formed on the metal layer 120.

Then, wires 150 connecting between the semiconductor devices 130 or electrically connecting the semiconductor devices 130 and the lead frames 140 to each other are formed (S111).

Thereafter, a molding 160 is formed on a base substrate 110 and in inner portions of the grooves 111 (S113).

Here, the molding 160 is formed so as to enclose an upper portion and a side of the base substrate 110.

As shown in FIG. 1, the molding 160 is formed so as to enclose both of the metal layer 120 and the semiconductor devices 130 on the base substrate 110 and also enclose the side of the base substrate 110. Here, in consideration of a heat radiation property, the molding 160 is formed in a form in which a lower surface of the base substrate 110 is exposed.

For example, since the molding 160 is formed in a form in which it is filled in the inner portions of the grooves 111, heat is not only blocked by the grooves 111 formed between the semiconductor device mounting areas but also secondarily blocked by the molding 160, thereby making it possible to further improve a heat radiation effect.

In addition, since the molding 160 is formed in a form in which it is filled in the grooves 111 formed in the base substrate 110, an adhesion between the molding 160 and the base substrate 110 is increased, thereby making it possible to improve long-term reliability of the substrate.

As set forth above, with the power module package and the method for manufacturing the same according to the preferred embodiments of the present invention, the grooves are formed between the areas on which the semiconductor device expected to generate high heat and the semiconductor device generating relatively low heat are mounted to thermally separate the semiconductor devices from each other, thereby making it possible to previously prevent an influence of the heat generated from the power device expected to generate the high heat on the control device.

In addition, according to the preferred embodiments of the present invention, the grooves formed in the base substrate block the heat transferred in a horizontal direction of the substrate, thereby making it possible to prevent a problem due to heat conduction between the semiconductor devices.

Further, according to the preferred embodiments of the present invention, the adhesion between the base substrate and the molding is improved by the grooves formed in the base substrate, thereby making it possible to improve the long-term reliability of the substrate.

Furthermore, according to the preferred embodiments of the present invention, the thickness of the base substrate in areas in which the grooves are formed in the base substrate is reduced to shorten a transfer route of the heat generated from the semiconductor device, thereby making it possible to effectively radiate the heat.

Although the preferred embodiments of the present invention have been disclosed for illustrative purposes, they are for specifically explaining the present invention and thus a power module package and a method for manufacturing the same according to the present invention are not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A power module package comprising:
   a base substrate having grooves formed between a plurality of semiconductor device mounting areas;
   a metal layer formed on the base substrate and including circuits and connection pads;
   semiconductor devices mounted on the metal layer of the semiconductor device mounting areas of the base substrate;
   lead frames formed on a portion of the metal layer; and
   a molding formed on the base substrate and in inner portions of the grooves.

2. The power module package as set forth in claim 1, wherein the semiconductor device includes a power device and a control device and the plurality of semiconductor device mounting areas include a power device mounting area and a control device mounting area, and
   the grooves are formed between the power device mounting area and the control device mounting area.

3. The power module package as set forth in claim 1, wherein the semiconductor device includes a power device and a control device and the plurality of semiconductor device mounting areas include a plurality of power device mounting areas, and
   the grooves are formed between each of the plurality of power device mounting areas.

4. The power module package as set forth in claim 1, wherein the semiconductor device includes a power device and a control device and the plurality of semiconductor device mounting areas include a plurality of power device mounting areas and a control device mounting area, and
   the grooves are formed between the power device mounting area and the control device mounting area or between each of the plurality of power device mounting areas.

5. The power module package as set forth in claim 1, further comprising:
   wires connecting between the semiconductor devices or electrically connecting the semiconductor devices and the lead frames to each other.

6. The power module package as set forth in claim 1, wherein the molding is formed so as to enclose an upper portion of the base substrate and a side thereof.

7. The power module package as set forth in claim 1, wherein the groove has a row form in which it is configured by a plurality of grooves.

8. The power module package as set forth in claim 1, wherein the base substrate is made of a ceramic.

9. A method for manufacturing a power module package, the method comprising:
   preparing a base substrate;
   forming grooves between a plurality of semiconductor device mounting areas of the base substrate;
   forming a metal layer including circuits and connection pads on the base substrate;
   mounting semiconductor devices on the metal layer of the semiconductor device mounting areas;
   forming lead frames on a portion of the metal layer; and
   forming a molding on the base substrate and in inner portions of the grooves.

10. The method as set forth in claim 9, wherein the semiconductor device includes a power device and a control device and the plurality of semiconductor device mounting areas include a power device mounting area and a control device mounting area, and
    wherein in the forming of the grooves, the grooves are formed between the power device mounting area and the control device mounting area.

11. The method as set forth in claim 9, wherein the semiconductor device includes a power device and a control device and the plurality of semiconductor device mounting areas include a plurality of power device mounting areas, and
    wherein in the forming of the grooves, the grooves are formed between each of the plurality of power device mounting areas.

12. The method as set forth in claim 9, wherein the semiconductor device includes a power device and a control device and the plurality of semiconductor device mounting areas include power device mounting areas and a control device mounting area, and
    wherein in the forming of the grooves, the grooves are formed between the power device mounting area and the control device mounting area or between each of the power device mounting areas.

13. The method as set forth in claim 9, wherein in the forming of the molding, the molding is formed so as to enclose an upper portion of the base substrate and a side thereof.

14. The method as set forth in claim 9, further comprising, before the forming of the moldings
    forming wires connecting between the semiconductor devices or electrically connecting the semiconductor devices and the lead frames to each other.

15. The method as set forth in claim 9, wherein the groove has a row form in which it is configured by a plurality of grooves.

16. The method as set forth in claim 9, wherein the base substrate is made of a ceramic.

17. A power module package comprising:
    a base substrate having grooves formed between a plurality of semiconductor device mounting areas;
    semiconductor devices mounted on the semiconductor device mounting areas of the base substrate; and
    a molding formed on the base substrate and in inner portions of the grooves;
    wherein the semiconductor device includes a power device and a control device and the plurality of semiconductor device mounting areas include a power device mounting area and a control device mounting area, and
    the grooves are formed between the power device mounting area and the control device mounting area.

18. A power module package comprising:
    a base substrate having grooves formed between a plurality of semiconductor device mounting areas;
    semiconductor devices mounted on the semiconductor device mounting areas of the base substrate; and
    a molding formed on the base substrate and in inner portions of the grooves;
    wherein the semiconductor device includes a power device and a control device and the plurality of semiconductor device mounting areas include a plurality of power device mounting areas, and
    the grooves are formed between each of the plurality of power device mounting areas.

19. A power module package comprising:
a base substrate having grooves formed between a plurality of semiconductor device mounting areas;
semiconductor devices mounted on the semiconductor device mounting areas of the base substrate; and
a molding formed on the base substrate and in inner portions of the grooves;
wherein the semiconductor device includes a power device and a control device and the plurality of semiconductor device mounting areas include a plurality of power device mounting areas and a control device mounting area, and
the grooves are formed between the power device mounting area and the control device mounting area or between each of the plurality of power device mounting areas.

20. A method for manufacturing a power module package, the method comprising:
preparing a base substrate;
forming grooves between a plurality of semiconductor device mounting areas of the base substrate;
mounting semiconductor devices on the semiconductor device mounting areas; and
forming a molding on the base substrate and in inner portions of the grooves;
wherein the semiconductor device includes a power device and a control device and the plurality of semiconductor device mounting areas include a power device mounting area and a control device mounting area, and
wherein in the forming of the grooves, the grooves are formed between the power device mounting area and the control device mounting area.

21. A method for manufacturing a power module package, the method comprising:
preparing a base substrate;
forming grooves between a plurality of semiconductor device mounting areas of the base substrate;
mounting semiconductor devices on the semiconductor device mounting areas; and
forming a molding on the base substrate and in inner portions of the grooves;
wherein the semiconductor device includes a power device and a control device and the plurality of semiconductor device mounting areas include a plurality of power device mounting areas, and
wherein in the forming of the grooves, the grooves are formed between each of the plurality of power device mounting areas.

22. A method for manufacturing a power module package, the method comprising:
preparing a base substrate;
forming grooves between a plurality of semiconductor device mounting areas of the base substrate;
mounting semiconductor devices on the semiconductor device mounting areas; and
forming a molding on the base substrate and in inner portions of the grooves;
wherein the semiconductor device includes a power device and a control device and the plurality of semiconductor device mounting areas include power device mounting areas and a control device mounting area, and
wherein in the forming of the grooves, the grooves are formed between the power device mounting area and the control device mounting area or between each of the power device mounting areas.

* * * * *